United States Patent
Lesieutre et al.

(10) Patent No.: US 6,236,143 B1
(45) Date of Patent: May 22, 2001

(54) TRANSFER HAVING A COUPLING COEFFICIENT HIGHER THAN ITS ACTIVE MATERIAL

(75) Inventors: George A. Lesieutre, State College, PA (US); Christopher L. Davis, Kent, WA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/380,122

(22) PCT Filed: Feb. 25, 1998

(86) PCT No.: PCT/US98/03713
§ 371 Date: Aug. 25, 1999
§ 102(e) Date: Aug. 25, 1999

(87) PCT Pub. No.: WO98/45677
PCT Pub. Date: Oct. 15, 1998

Related U.S. Application Data

(60) Provisional application No. 60/039,484, filed on Feb. 28, 1997.

(51) Int. Cl.$^7$ .................................................. H01L 41/08
(52) U.S. Cl. ......................................... 310/331; 310/328
(58) Field of Search .................................. 310/328, 330, 310/331, 338

(56) References Cited

U.S. PATENT DOCUMENTS

| | | | |
|---|---|---|---|
| 3,578,994 | * 5/1971 | Masea | 310/328 |
| 4,601,539 | * 7/1986 | Watanabe | 310/369 |
| 4,964,106 | * 10/1990 | Bromfield | 367/165 |
| 5,216,316 | * 6/1993 | Ipcinski | 310/338 |
| 5,284,058 | * 2/1994 | Jones | 73/579 |
| 5,431,058 | * 7/1995 | Lagier et al. | 310/337 |
| 5,973,441 | * 10/1999 | Lo et al. | 310/330 |

* cited by examiner

Primary Examiner—Thomas M. Dougherty
(74) Attorney, Agent, or Firm—Ohlandt, Greeley, Ruggiero & Perle, L.L.P.

(57) ABSTRACT

A coupling coefficient is a measure of the effectiveness with which a shape-changing material (or a device employing such a material) converts the energy in an imposed signal to useful mechanical energy. Device coupling coefficients are properties of the device and, although related to the material coupling coefficients, are generally different from them. This invention describes a class of devices wherein the apparent coupling coefficient can, in principle, approach 1.0, corresponding to perfect electromechanical energy conversion. The key feature of this class of devices is the use of destabilizing mechanical pre-loads to counter inherent stiffness. The approach is illustrated for piezoelectric and thermoelectrically actuated devices. The invention provides a way to simultaneously increase both displacement and force, distinguishing it from alternatives such as motion amplification, and allows transducer designers to achieve substantial performance gains for actuator and sensor devices.

24 Claims, 4 Drawing Sheets

TRANSFER HAVING A COUPLING COEFFICIENT HIGHER THAN ITS ACTIVE MATERIAL

This Application claims priority from Provisional Application 60/039,484, filed Feb. 28, 1997.

The United States Government has rights under this Application as a result of support of development of the invention described herein by NASA Langley Research Center (NASI-20205) and the Office of Naval Research (N00014-96-1-1173).

FIELD OF THE INVENTION

This invention relates to transducer devices and, more particularly, to piezoelectric devices which exhibit enhanced coupling coefficients.

BACKGROUND OF THE INVENTION

Many mechanical transducers employ shape-changing materials as an integral part of their construction. An example of a material exhibiting such behavior is a piezoelectric ceramic. In the case of actuators, shape changes or strains, are the result of the application of an imposed external signal, such as an electric field. Device performance depends intimately on the ability of these materials to convert energy from one form to another. One measure of the effectiveness with which a material or device converts the energy in an imposed signal to useful mechanical energy is the coupling coefficient.

One definition of a coupling coefficient is the following: the ratio of the energy converted to that imposed is equal to the square of the coupling coefficient, k. Thus, no material coupling coefficient can be greater than 1.0, as this represents the limit of 100% conversion of imposed energy to mechanical energy. In addition, as the result of the ability to impose signals in different ways, as well as the ability of a material to strain in different ways, any material has multiple coupling coefficients corresponding to different modes of excitation and response. The largest coupling coefficients for piezoelectric ceramic materials are on the order of 0.7, corresponding to energy conversion factors of about 50%. Considerable research has addressed the development of new material compositions that might exhibit higher electromechanical coupling. See: Cross, et al., "Piezoelectric and Electrostrictive Materials for Transducer Applications", 1991 Annual Report, ONR Contract No. N00014-89-J-1689.

Devices made using such active materials are also said to have coupling coefficients. These are properties of the device and, although related to the material coupling coefficients, are generally different from them. Various device coupling coefficients can also be defined, corresponding to specific modes of excitation and response. Accepted design guidelines suggest two ways to maximize device (and composite material) coupling coefficients: 1) use a material with high inherent coupling; and 2) configure the device so as to best use the available material coupling. See: Wallace et al., "The Key Design Principle for Piezoelectric Ceramic/Polymer Composites," Recent Advances in Adaptive and Sensory Materials and Their Applications, pp. 825–838, Apr. 27–29, 1992; and Smith et al., "Maximal Electromechanical Coupling in Piezoelectric Ceramics-Its Effective Exploitation in Acoustic Transducers," Ferroelectrics, 134, pp. 145–150, 1992.

Considerable research has addressed ways to exploit material coupling, resulting in devices such as the "moonie". see U.S. Pat. No. 4,999,819. It is commonly held that no device coupling coefficient can be greater than the largest coupling coefficient of the active material used in the device.

Piezoelectric Coupling Coefficients
Piezoelectric Material Coupling

The behavior of piezoelectric materials involves coupled mechanical and electrical response. The constitutive equations of a linear piezoelectric material can be expressed in terms of various combination of mechanical and electrical quantities (stress or strain, electric field or electric displacement). In light of the popularity of the modern displacement-based finite element method, the constitutive equations used herein employ the strain and electric fields. (Strain is related to the gradient of the mechanical displacement field, while electric field is the gradient of the electric potential field.) In condensed matrix notation, the nine constitutive equations for a typical piezoelectric ceramic material are:

$$\left\{\frac{T}{D}\right\} = \left[\begin{array}{c|c} c^E & -e^T \\ \hline e & \varepsilon^S \end{array}\right] \left\{\frac{S}{E}\right\} \quad (1)$$

where
- T is the stress vector; S is the strain vector (6 components each);
- D is the electric displacement vector;
- E is the electric field vector (3 components each);
- $c^E$ is a matrix of elastic coefficients (at constant electric field);
- e is a matrix of piezoelectric coefficients; and
- $\epsilon^S$ is a matrix of dielectric permittivities (at constant strain).

Simple Strain/Electric Field Patterns

In engineering analysis, materials may sometimes be assumed to experience a state in which only a single stress or strain component is non-zero, and in which only a single electric field or electric displacement component is non-zero. In that event, the nine constitutive equations may be reduced to two, so that the matrices of coefficients become scalars. The corresponding single coupling coefficient may be found from either:

The difference between the open-circuit (constant electric displacement) stiffness ($c^D$) and the short circuit (constant electric field) stiffness ($c^E$):

$$k^2 = \frac{c^D - c^E}{c^D} = \frac{\left(c^E + \frac{e^2}{\varepsilon^S}\right) - c^E}{\left(c^E + \frac{e^2}{\varepsilon^S}\right)} = \frac{e^2}{(c^E \varepsilon^S + e^2)} \quad (2)$$

The difference between the free (constant stress) permittivity ($\epsilon^T$) and the blocked (constant strain) permittivity ($\epsilon^S$):

$$k^2 = \frac{\varepsilon^T - \varepsilon^S}{\varepsilon^T} = \frac{\left(\varepsilon^S + \frac{e^2}{C^E}\right) - \varepsilon^S}{\left(\varepsilon^S + \frac{e^2}{C^E}\right)} = \frac{e^2}{(c^E \varepsilon^S + e^2)} \quad (3)$$

Eigen Strain/Electric Field Patterns

Eigenanalysis of the constitutive equations for a typical piezoelectric ceramic material reveals that only three characteristic strain/electric field patterns exhibit electromechanical coupling. Because each stress/electric displacement pattern is related to the corresponding strain/electric field pattern by a scalar (the eigenvalue), individual patterns may be considered to be effectively one-dimensional; the total electromechanical system may then be considered as a set of parallel one-dimensional systems. When the conventional coordinate system is used ("3") the poling direction, and "1–2" the plane of isotropy), the three patterns which exhibit electromechanical coupling involve the three components of the electric field vector individually; the first two involve shears in planes normal to the plane of isotropy, and the third involves a combination of all three normal strains. For many materials, the coupling coefficient associated with each of these three eigen patterns is about 0.70.

Arbitrary Strain/Electric Field Patterns

An effective coupling coefficient may be defined for an arbitrary quasistatic electromechanical state of the material from energy considerations. For the selected form of the constitutive equations (block skew symmetric), the total energy density is the sum of the mechanical (strain) energy density and the electrical (dielectric) energy density:

$$U_{tot} = U_{mech} + U_{elec} \quad (4)$$

where $$U_{mech} = \frac{1}{2}\{S\}^T[c^E]\{S\}$$

and $$U_{elec} = \frac{1}{2}\{E\}^T[\varepsilon^S]\{E\}$$

Although with this form of the constitutive equations there is no "mutual" energy density, a "one-way coupled" energy density may be defined as:

$$U_{coup} = \frac{1}{2}\{E\}^T[e]\{S\} = \frac{1}{2}\{S\}^T[e^T]\{E\} \quad (5)$$

With these definitions, an effective coupling coefficient for an arbitrary electromechanical state may be defined as:

$$k^2 = \frac{U_{coup}}{U_{tot}} = \frac{U_{coup}}{U_{mech} + U_{elec}} \quad (6)$$

Of course, this relation is most meaningful when the state considered corresponds to a quasistatic equilibrium attained as the result of some electromechanical loading process starting from zero initial conditions. Also, since any electromechanical state of the material can be expressed as a linear combination of the eigen patterns discussed in the preceding, the coupling coefficient associated with an arbitrary state cannot be greater than the largest eigen coupling coefficient.

When the electromechanical loading process corresponds to purely electrical or purely mechanical loading, special cases of Eq. 6 may be developed. In that case, the total energy is equal to the work done by the loading system, and the transduced energy is equal to the one-way coupled energy defined in Eq. 7.

For purely electrical loading, the coupling coefficient may be expressed as:

$$k^2 = \frac{U_{elec}}{W_{elec}} \quad (7)$$

where $$W_{elec} = \frac{1}{2}\{D\}^T\{E\}$$

For purely mechanical loading, the coupling coefficient may be expressed as:

$$k^2 = \frac{U_{elec}}{W_{mech}} \quad (8)$$

where $$W_{mech} = \frac{1}{2}\{T\}^T\{S\}$$

Piezoelectric Device Coupling

The stiffness of non-active elements tends to reduce device coupling coefficients relative to material coefficients. Definitions of coupling coefficients for piezoelectric devices must also recognize that the electromechanical response will generally be non-homogeneous within the device. Versions of any of the preceding energy-based definitions of material coupling coefficients (Eqs. 6, 7, 8) may be applied to devices, so long as the work and energy quantities are considered for the entire device (for example, energy densities must be integrated over the device volume). Further, if the electromechanical equations describing the device are expressed in terms of scalar stiffness and capacitance coefficients, methods analogous to the simple material coefficient method (Eqs. 2 (stiffness), and 3 (capacitance)) may also be used with success.

Piezoelectric devices are often used dynamically, to induce or to sense motion. In that case, a dynamic definition of coupling coefficient may be obtained for each combination of electrical leads and natural vibration modes, based on the difference between the open-circuit natural vibration frequency ($\omega^D$) and the short circuit natural vibration frequency $$k^2 = \frac{(\omega^D)^2 - (\omega^E)^2}{(\omega^D)^2} \quad (9)$$

Note that under static, homogeneous conditions, this reduces to Eq. 2.

Prior Art Bimorph Transducers

FIG. 1 shows a schematic of a prior art bimorph actuator which comprises a base beam 10 of non-piezoelectric material with thin layers 12 and 14 of piezoelectric material bonded to its opposing faces. In the most common configurations, the piezoelectric components are monolithic piezoceramics that are poled in the direction normal to the plane of base beam 10. The bimorph operates in such a way that electrical excitation in the poling direction causes the beam to bend laterally. The bending is accomplished by driving the piezoelectric members in opposite directions, causing one to extend and one to contract. The actuator of FIG. 1 can be converted to a transducer by monitoring voltages that are induced as a result of induced flexure of beam 10 and piezoelectric layers 12 and 14.

It is an object of this invention to provide an improved piezoelectric transducer which exhibits an improved coupling coefficient.

SUMMARY OF THE INVENTION

It has been determined that a class of transducers can be constructed wherein the apparent coupling coefficient can, in principle, approach 1.0, corresponding to perfect electromechanical energy conversion. The key feature of this class of devices is the use of destabilizing mechanical pre-loads to counter inherent stiffness in the beam structures. The approach is usable with piezoelectric, monomorph, bimorph and axisymmetric devices.

DETAILED DESCRIPTION OF THE PREFERRED EMBODIMENT

It has been determined that the effective coupling coefficient of a piezoelectric device may be increased by placing the supporting beam of the piezoelectric transducer in compression. Inspection of Eq. 2, reproduced here using "device" terms rather than "material" terms $$k^2 = \frac{e^2}{(c^E \varepsilon^S + e^2)}$$

shows that if the stiffness ($c^E$) is reduced without affecting the capacitance ($\varepsilon^S$) or the piezoelectric coupling (e), the coupling coefficient will be increased. Furthermore, as the stiffness approaches zero, the coupling coefficient will approach unity.

Device Configuration and Assumptions

Figure 1:
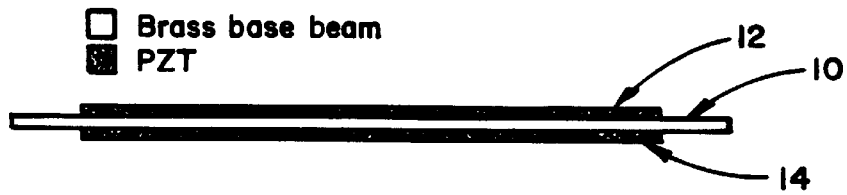
FIG. 1 is a schematic view of a prior art bimorph transducer.
Figure 2:
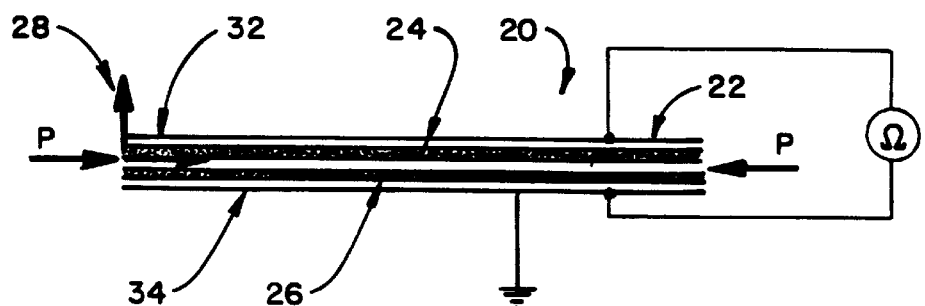
FIG. 2 is a schematic view of a prior art bimorph transducer configured in accord with the invention hereof.

The concept for increasing device electromechanical coupling coefficients using destabilizing mechanical pre-loads is illustrated in FIG. 2 through consideration of a planar piezoelectric bimorph 20. FIG. 2 shows a schematic of such a device, as well as the origin and orientation of the coordinate system. Piezoelectric bimorph 20 comprises a base beam 22 made of a non-piezoelectric material, with thin layers 24 and 26 of piezoelectric material bonded to its upper and lower surfaces (or, directly to one another). In the most common realization, these pieces are monolithic piezoceramics and are poled in the direction normal to the plane of the beam (along arrow 28).

A bimorph operates in such a way that electrical excitation in the poling direction 28 causes the beam to bend laterally. This is accomplished by driving the piezoceramics in opposition by application of voltage to electrodes 32 and 34, causing an extension of one side and a contraction of the other. Base beam 22 (which in this embodiment is conductive) is placed under compression by application of force P to its respective ends. The sandwiching piezoelectric layers also experience compression via inter action with base beam 22. Further, while the description will hereafter consider a device utilizing a base beam 22, it is to be understood that the piezoelectric layers may be directly bonded to each other, without a supporting base beam. Accordingly, the invention is to be considered as covering both configurations.

For illustration, the device will be assumed to be simply supported, and modeled as a symmetric composite (multi-element) beam. Let cross-sections be identified by the longitudinal x coordinate 30, and let the lateral motion in the direction 28 of the midplane be denoted w(x). The following kinematic assumptions are made:

Transverse shear strains are negligible. Therefore, the longitudinal motion of a point in a cross-section, u(x), is proportional to the bending rotation of the cross-section, and to the distance from the midplane, z. The deformation of the beam can be characterized fully by the longitudinal normal strain, $S_{11}$.

$$u(x, z) = -z \frac{\partial w}{\partial x} = -zw' \quad (10, 11)$$

and $$S_{11}(x, z) = \frac{\partial u}{\partial x} = -zw''$$

The beam is inextensible, that is, changes in the developed length of the midplane are negligible. The axial load can only do work when the beam bends and its two ends move closer together.

Since transverse shear strains are negligible, and neither $E_1$ nor $E_2$ is prescribed, the only electrical field of significance is $E_3$. The electrical potential, $\Phi$, is assumed to vary linearly through the thickness of the piezoelectric layers, $h_p$, but not at all along the length because the upper and lower surfaces are electroded (equipotential). The voltage, V, at the outer surfaces is the same, and zero at the inner surfaces.

$$E_3(z) = -\frac{\partial \Phi(z)}{\partial k} = \left\{ -\frac{V}{h_p} \text{ top; } +\frac{V}{h_p} \text{ bottom} \right\} \quad (12)$$

Under the preceding conditions, the material constitutive equations reduce to the following one-dimensional form:

$$\left\{ \frac{T_{11}}{D_3} \right\} \begin{bmatrix} c^E & -e^T \\ e & \varepsilon^S \end{bmatrix} \left\{ \frac{S_{11}}{E_3} \right\} \quad (13)$$

The focus bimorph is characterized by the following geometric and material properties. Sample numerical values (SI units) are also shown for later use.

| | Base Beam (aluminum) | |
|---|---|---|
| $h_b$ | thickness | 0.0010 |
| b | width | 0.0100 |
| L | length | 0.1000 |
| $c^E_b$ | Young's modulus | 7.000e+10 |
| $\rho_b$ | density | 2750 |
| | Piezoelectric Ceramic (PZT-5A; full set of material constants) | |
| $h_p$ | thickness | 0.0005 |
| $c^E_p$ | Young's modulus (constant electric field) | 6.152e+10 |
| $e_p$ | piezoelectric coefficient | −10.48 |
| $\varepsilon^S_p$ | dielectric permittivity (constant strain) | 1.330e−08 |
| $\rho_p$ | density | 7250 |

-continued

Axial Load

P    axial load (compression is positive)

(Note: Using Eq. 2, the material coupling coefficient, $k_{31} = 0.344$.)

Model and Governing Equations

The governing equations for this multi-layered piezoelectric beam may be found using the method of virtual work or Hamilton's Principle. Because the beam is assumed to be uniform and simply-supported, the fundamental vibration mode and the buckling mode are both half-sinusoids. Therefore, an assumed-modes method based on a such a shape function yields the exact solution for the first mode. The transverse deflection of the midplane is then given by:

$$w(x,t) = d(t)\sin\left(\frac{\pi x}{L}\right) \quad (14)$$

where $d(t)$ is the magnitude of the lateral deflection at the center of the beam. Application of the assumed modes method of analysis leads to the following two coupled equations:

$$\begin{bmatrix} m & 0 \\ \hline 0 & 0 \end{bmatrix}\begin{Bmatrix} \ddot{d} \\ \ddot{V} \end{Bmatrix} + \begin{bmatrix} K^E - K_G & -p^T \\ \hline p & C^S \end{bmatrix}\begin{Bmatrix} d \\ V \end{Bmatrix} = \begin{Bmatrix} 0 \\ Q \end{Bmatrix} \quad (15)$$

where $d$ is the discrete displacement variable, $V$ is the voltage across the device terminals, and $Q$ is the charge imposed on the device. Note that direct mechanical forcing of lateral motion is omitted.

The device electromechanical coefficients are:

$$\text{mass} \quad m = b(\rho_b h_b + 2\rho_p h_p)\frac{L}{2} \quad (16a)$$

$$\text{stiffness} \quad K^E = b\left(c_b^E \frac{h_b^3}{12} + 2c_p^E\left(\frac{h_p^3}{12} + h_p\left(\frac{h_b + h_p}{2}\right)^2\right)\right)\left(\frac{\pi}{L}\right)^4 \frac{L}{2} \quad (16b)$$

$$\text{capacitance} \quad C^S = 2\varepsilon^S \frac{bL}{h_p} \quad (16c)$$

$$\text{piezoelectric coupling} \quad p = 2be(h_b + h_p)\left(\frac{\pi}{L}\right) \quad (16d)$$

$$\text{"geometric" stiffness} \quad K_G = P\left(\frac{\pi}{L}\right)^2 \frac{L}{2} \quad (16e)$$

Note that the work done by the axial pre-load is represented as the "geometric stiffness," and that its main effect is to reduce the effective lateral stiffness of the layered device. In fact, if the axial load P is made high enough, $K_G$ will fully counteract $K^E$ and the beam will be on the verge of instability. The corresponding value of P is $P_{cr}$, the critical load for buckling.

Coupling Coefficients of the Axially-Loaded Piezoelectric Bimorph

Without Axial Load

A first estimate of the device coupling coefficient may be obtained by multiplying the material coupling coefficient by the fraction of the stiffness associated with extension of the midplanes of the piezoelectric layers. For the sample numerical values used, this fraction is about 0.83. The coupling coefficient of the piezoelectric material used is 0.344. The resulting device coupling coefficient estimated in this manner is 0.286.

Additional estimates of the device coupling coefficient may be obtained by extending Eqs. 2 (stiffness change due to electrical boundary conditions) and 3 (capacitance change due to mechanical boundary conditions) to devices. For the sample numerical values used, a value of 0.288 is obtained. Use of Eq. 9 (change in natural vibration frequency due to electrical boundary conditions) yields the same result.

By doing electrical work on the device (imposing a charge, Q) and finding the equilibrium displacement/voltage state, Eq. 6 or 7 may also be used to obtain an estimate of the device coupling coefficient, with the same result, 0.288.

With Axial Load

The definitions of coupling coefficient used in the preceding must be modified to reflect the action of an external compressive load. Depending on the way the axial load is considered, both "apparent" and "proper" coupling coefficients may be defined.

"Apparent" coupling coefficient. Treating the axial load simply as a reduction of effective lateral stiffness of the device suggests the definition of an "effective" or "apparent" coupling coefficient. Eqs. 2 (stiffness) and 3 (capacitance) can be used with the simple modification of replacing $K^E$ with the quantity $(K^E - K_G)$, the effective or net lateral stiffness. Eq. 9 (frequency) can be used directly. Clearly, as the load approaches the buckling load, the apparent coupling coefficient approaches 1.0.

An energy approach can be adopted to yield similar results. Consider the following definitions of energy- and work-related quantities:

$$W_{tot} = W_{elec} + W_{mech} \quad \text{where} \quad W_{elec} = \frac{1}{2}QV \quad \text{and} \quad W_{mech} = \frac{1}{2}K_G d^2 \quad (17)$$

$$U_{tot} = U_{elec} + U_{mech} \quad U_{elec} = \frac{1}{2}C^S V^2 \quad U_{mech} = \frac{1}{2}K^E d^2 \quad (18)$$

$$U_{coup} = \left|\frac{1}{2}p\,Vd\right| \quad (19)$$

Clearly, Eq. 7 cannot be used directly as it could lead to coupling coefficients greater than 1.0. It might be reasonably modified, however, to omit the work done by the mechanical pre-load from the mechanical strain energy, as follows:

$$k_{app}^2 = \frac{U_{mech} - W_{mech}}{W_{elec}} \quad (20)$$

The numerator can be interpreted as that part of the mechanical energy stored that is due to the input of electrical energy, and Eq. 20 yields results consistent with the stiffness reduction approach. An alternate approach involves considering the ratio of the one-way coupled energy to the electrical work input:

$$k_{app}^2 = \frac{U_{coup}}{W_{elec}} \quad (21)$$

This approach, too, yields results consistent with the stiffness reduction approach.

"Proper" coupling coefficient. Although the "apparent" coupling coefficient appears to be a practical definition based on the interconversion of mechanical energy associated with lateral deformation and electrical energy, a "proper" coupling coefficient might be defined by treating the work done by the compressive axial pre-load as work, and not simply as a stiffness reduction. Such a definition would have the same general form as Eq. 6:

$$k_{proper}^2 = \frac{U_{coup}}{W_{tot}} = \frac{U_{coup}}{U_{tot}} = \frac{U_{coup}}{U_{mech} + U_{elec}} = \frac{U_{coup}}{W_{mech} + W_{elec}} \quad (22)$$

Figure 3:
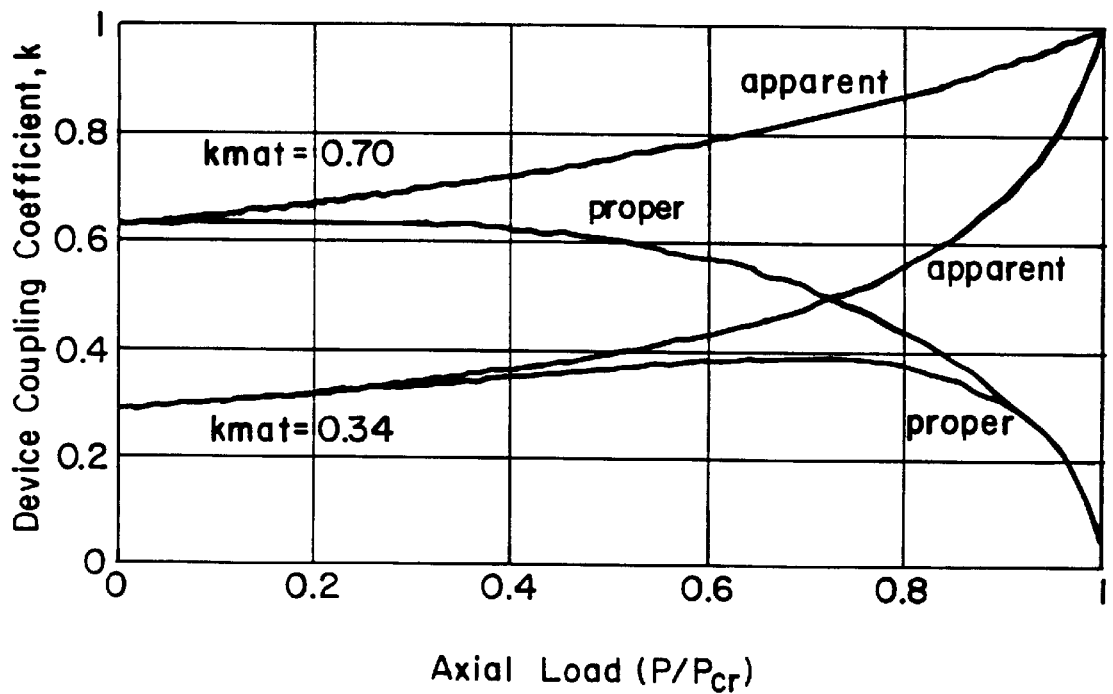
FIG. 3. is a plot of variation of "apparent" and "proper" coupling coefficients with axial pre-load.

FIG. 3 shows the theoretical relationship between the "apparent" and "proper" coupling coefficients for the piezoelectric bimorph and the axial pre-load. Two pairs of curves are shown: the lower pair corresponds to the nominal case of material coupling of 0.34, while the upper pair corresponds to material coupling of 0.70. In all cases, the device coupling coefficient increases initially as the load increases from zero. For both inherent material coupling values, the "apparent" coupling coefficient approaches 1.0 as the load approaches the buckling load, while the "proper" coupling coefficient attains a maximum value, then approaches 0.0 with increasing load. Even at modest pre-load levels, device coupling coefficients can increase substantially from their unloaded values, and can exceed the coupling coefficient of the active material used.

The destabilizing pre-load is observed to increase bimorph device coupling coefficients, by either definition. In practice, however, because the pre-load may be obtained by passive design, the "apparent" coupling coefficient may be a better measure of the useful coupling between mechanical and electrical signals.

Experimental

Figure 4:
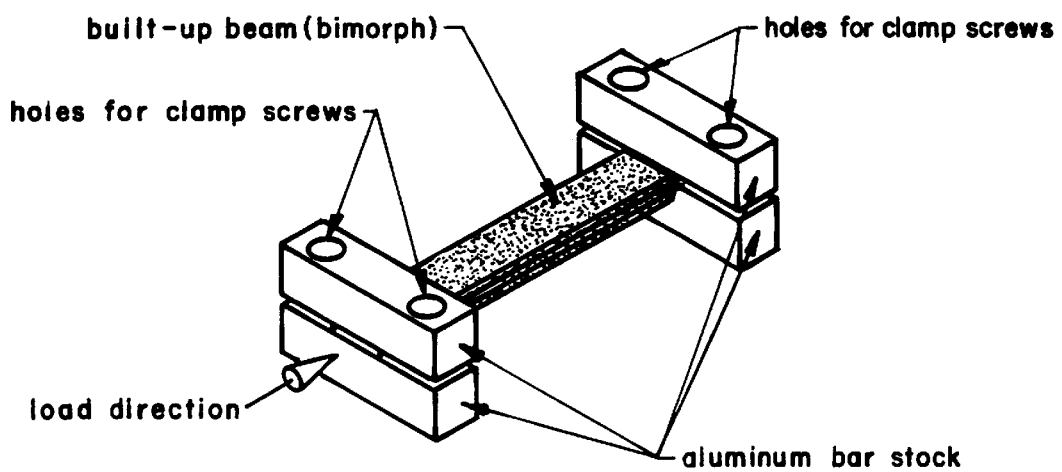
FIG. 4. is a perspective view of a clamped-clamped bimorph test apparatus.

An experiment was performed to investigate the effect of a compressive axial pre-load on the apparent coupling coefficient of a piezoelectric bimorph. The experimental bimorph consisted of a built-up beam under clamped-clamped boundary conditions. As shown in FIG. 4, the built-up beam comprised a brass base beam and two piezoelectric plate elements (Piezo Kinetics Incorporated PKI 500 Lead Zirconate Titanate). Clamped-clamped boundary conditions were simulated by clamping the uncovered brass beam ends between two pieces of 0.375"×0.750"×2.500" aluminum bar stock. The ends of the brass base beam were made flush with the outside surfaces of the aluminum clamps and a small gap was left between the inside surface of the aluminum clamps and the PZT. This configuration ensured the axial load would only be applied to the brass base beam, thus avoiding direct axial loading of the attached PZT. Screws were used to hold the aluminum blocks in place and to prevent any rotation of the bimorph specimen at the clamp ends. Electrical leads were attached using a low temperature solder.

Table 1 summarizes the material properties of the bimorph specimen. The PZT was bonded to the brass beam with Devcon 5 Minute® Epoxy. A small amount of conducting epoxy (Emerson & Cuming Eccobond Solder 56C mixed with Catalyst 9) was used on a tiny area of the bond surface to ensure electrical conduction of the PZT electrodes to the brass beam, which was used as an electrical terminal.

TABLE 1

Bimorph material and geometry

| Material Property | Brass Base Beam | Lead Zirconate Titanate PKI 500 |
|---|---|---|
| Modulus [N/m^2] | 105.0E+9 | 64.9E+9 * |
| Density [kg/m^3] | 8470 | 7600 |
| Gagelength [mm] | 75 | 75 |

TABLE 1-continued

Bimorph material and geometry

| Material Property | Brass Base Beam | Lead Zirconate Titanate PKI 500 |
|---|---|---|
| Width [mm] | 12.7 | 12.7 |
| Thickness [mm] | 0.8306 | 0.8611 |
| coupling coefficient | — | 0.34 |

* short-circuit modulus

The boundary conditions differed from those assumed in the preceding theoretical section because a clamped boundary was significantly easier to implement than a simply-supported condition. The clamped boundary in combination with piezoelectric elements that were nearly as long as the gage length of the base beam reduced the nominal coupling coefficient substantially.

Figure 5:
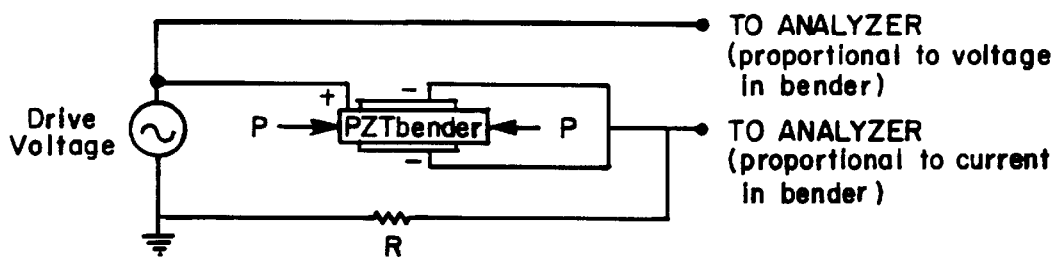
FIG. 5. is a schematic of bimorph electrical impedance measurement circuit used with the invention.

The electrical impedance of the bimorph was determined experimentally by measuring the ratio of voltage to current (V/I) in a circuit including the bimorph. FIG. 5 shows a schematic of the circuit used in the measurement. The resistor in the circuit, R, was much smaller than the impedance of the bimorph (R~1?). Thus, the current in the resistor (also the current in the bimorph) was proportional to and thus approximately equal to the voltage across the resistor. Because the voltage drop across the bimorph was much larger than the voltage drop across the resistor, the voltage across the bimorph was very nearly equal to the drive voltage.

The device electrical impedance was measured using a Hewlett Packard 3563A Control System Analyzer using the circuit shown in FIG. 5. The initial drive voltage used was a 1.5 $V_{rms}$ periodic chirp signal from 0 to 1.6 kHz. Channel #1 of the signal analyzer measured the voltage across the resistor (proportional to the current in the bimorph), and channel #2 measured the total applied voltage (the voltage across the bimorph). The resulting complex frequency response measurement is proportional to the electrical impedance.

A low frequency zero was introduced as a result of the impedance-measuring approach. The frequency of the next zero (minimum value), $f_z$, corresponded to the short-circuit natural frequency of the bimorph, as V was very nearly zero. The frequency of the nearby pole (maximum value), $f_p$, corresponded to the open-circuit natural frequency of the bimorph, as I was very nearly zero. The apparent coupling coefficient was determined using Eq. 9. The ratio of the axial load to the critical load ($P/P_{cr}$) for a given data point was estimated from the change in short-circuit frequency, $f_z$ (relative to its initial no-load value, $f_z 0$), using the following relation:

$$P/P_{cr} = 1 - \left(\frac{f_z}{f_{z0}}\right)^2$$

A compressive axial load was applied to the specimen using a large adjustable clamp. Testing proceeded as follows: First, the bimorph was placed between the jaws of the adjustable clamp with just enough pressure to ensure that the aluminum bimorph clamps could not move axially or rotate. This was considered the no-load condition. A frequency response measurement of electrical impedance was made using a periodic chirp drive voltage signal between 0 and 1.6 kHz. Next, a swept sine measurement was made over a much smaller frequency range containing the zero and pole frequencies. A curve fit of the swept sine data yielded numerical estimates for the zero and pole frequencies.

Figure 6:
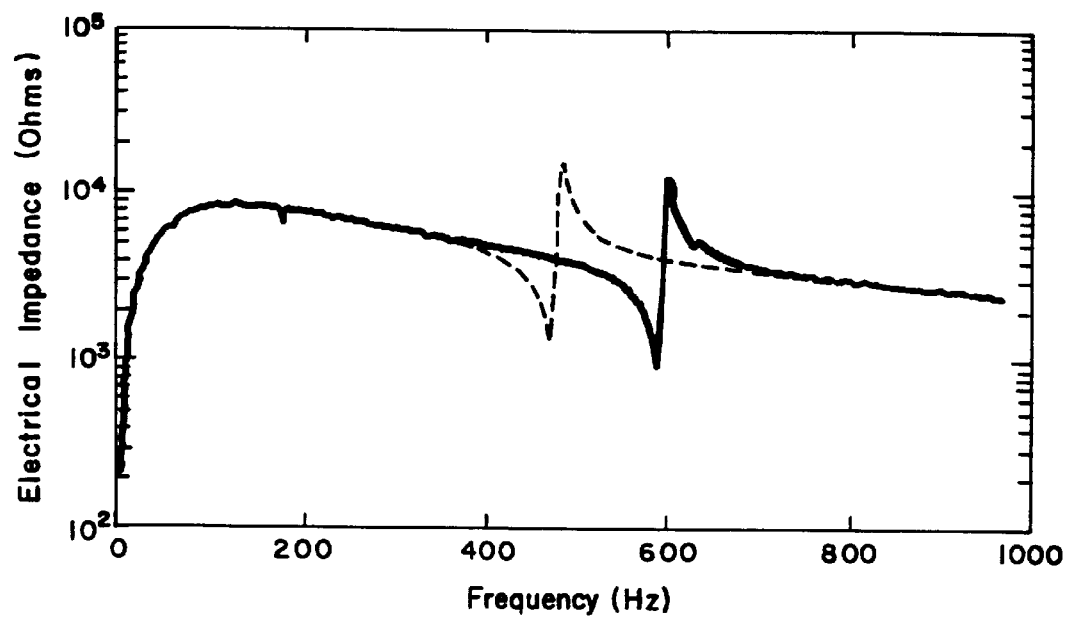
FIG. 6 is a plot of experimental device electrical impedance-measurements.

After curve fitting the swept sine data, the load was increased slightly and the measurement process repeated. FIG. 6 shows plots of device electrical impedance for two load cases, $P/P_{cr}=0.35$ (solid line) and $P/P_{cr}=0.50$ (dashed line). Note that both the short-circuit and open-circuit natural frequencies decrease as the load increases, but that the relative separation increases. This increasing separation corresponds to an increase in apparent coupling coefficient.

Figure 7:
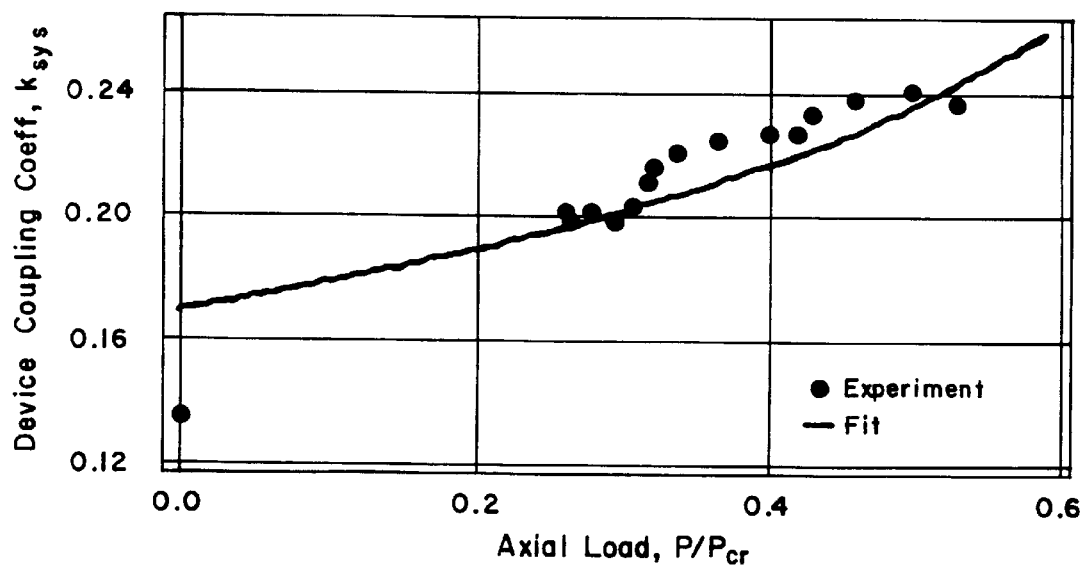
FIG. 7 is a plot of measured device coupling coefficient as a function of axial pre-load.

FIG. 7 shows the measured apparent device coupling coefficient as a function of axial load. The symbols indicate the measured data, while the solid line is a curve fit based on the model described in the preceding. In this curve fit, only the unloaded coupling coefficient was regarded as unknown. Note that the coupling coefficient increases substantially as the compressive pre-load increases. In addition, note the general agreement of the data with theory.

Further Embodiments

Figure 8:
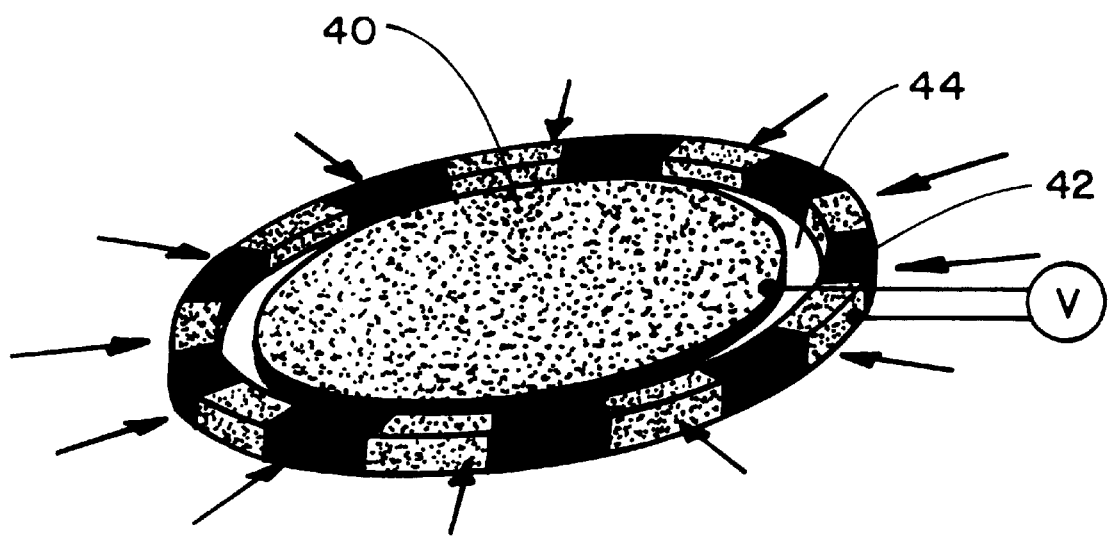
FIG. 8 is a perspective view of an axisymmetric transducer constructed in accord with the invention.

While the invention has been described in the context of a bimorph beam arrangement, it can also be configured in the form of a monomorph or an axisymmetric device. FIG. 8 illustrates an axisymmetric device wherein a circular bimorph structure 40 is surrounded by a compression fitting 42 which places the central support layer 44 under uniform compression about its periphery. Application of voltage to the sandwich layers of piezoelectric material will result in an actuating movement of the bimorph device.

Further, if the device is to be used as a sensor, a voltage detector is connected to the piezoelectric electrodes, enabling changes in voltage thereacross to be sensed as a result of induced movements of bimorph 40. Also, instead of piezoelectric actuating devices, layers having different coefficients of thermal expansion than the center support beam can be adhered to the center support beam. The actuation of such a structure is accomplished by selective heating of the actuating layers, with the center beam held in compression as described above.

In summary, a class of transducers has been identified in which the apparent coupling coefficient can, in principle, approach 1.0, corresponding to perfect electromechanical energy conversion. The key feature of this class of devices is the use of destabilizing mechanical pre-loads to counter inherent stiffness. Experimental evidence predicts a smooth increase of the apparent coupling coefficient with pre-load, approaching 1.0 at the buckling load. From energy considerations, two alternative device coupling coefficients have been defined: an "apparent" coupling coefficient that treats the destabilizing pre-load as a reduction in stiffness; and a "proper" coupling coefficient that explicitly treats the pre-load as a source of mechanical work on the device. By either definition, device coupling coefficient increases initially as the pre-load increases from zero. As the load continues to increase towards the critical buckling load, the "apparent" coupling coefficient approaches 1.0, while the "proper" coupling coefficient attains a maximum value, then approaches 0.0. Even at modest pre-load levels, device coupling coefficients can increase substantially from their unloaded values, and can exceed the coupling coefficient of the active material used. In practice, because the pre-load may be obtained by passive design, the "apparent" coupling coefficient may be a better measure of the useful coupling between mechanical energy associated with transverse motion and electrical energy.

This approach provides a way to simultaneously increase both the operating displacement and force of a piezoelectric device and may allow transducer designers to achieve substantial performance gains for actuator and sensor devices.

What is claimed is:

1. An actuator comprising:
   a) a support beam;
   b) a first means for placing said support beam in compression without causing flexure of said support beam;
   c) a first layer of material adhered to a first surface of said support beam; and
   d) a second means for causing movement of said first layer of material to cause a flexure of said layer of material and said support beam.

2. The actuator as recited in claim 1, wherein said first layer of material is a piezoelectric material.

3. The actuator as recited in claim 2, wherein a second layer of piezoelectric material is adhered to an opposing surface of said support beam and said second means for causing movement further causes a movement of said second layer in such a manner as to aid in the movement of said support beam that is induced by said first layer.

4. The actuator as recited in claim 1 wherein said support beam is symmetric about an axis that is orthogonal to said first surface of said support beam and said first means for placing said support beam in compression applies substantially uniform compressive forces about a periphery of said support beam.

5. The actuator as recited in claim 1 wherein said support beam is elongated and is supported at opposed extemities thereof by support means which further apply opposing compressive forces thereto.

6. The actuator as recited in claim 1, wherein said first layer of material evidences a thermal coefficient of expansion that is different than a thermal coefficient of expansion of said support beam.

7. The actuator as recited in claim 6, wherein a second layer of layer of material, evidencing a thermal coefficient of expansion that is different than said thermal coefficient of expansion of said support beam, is adhered to an opposing surface of said support beam and said second means for causing movement further causes a movement of said second layer in such a manner as to aid in the movement of said support beam that is induced by said first layer.

8. The actuator as recited in claim 7 wherein said support beam is symmetric about an axis that is orthogonal to said first surface of said support beam and said first means for placing said support beam in compression applies substantially uniform compressive forces about a periphery of said support beam.

9. The actuator as recited in claim 7 wherein said support beam is elongated and is supported at opposed extemities thereof by support means which further apply opposing compressive forces thereto.

10. A transducer comprising:
   a) a support beam;
   b) a first means for placing said support beam in compression without causing flexure of said support beam;
   c) a first layer of material adhered to a first surface of said support beam; and
   d) a second means for responding to a flexure of said layer of material and said support beam for outputting a signal indicative thereof.

11. The transducer as recited in claim 10, wherein said first layer of material is a piezoelectric material.

12. The transducer as recited in claim 11, wherein a second layer of piezoelectric material is adhered to an opposing surface of said support beam.

13. The transducer as recited in claim 10 wherein said support beam is symmetric about an axis that is orthogonal to said first surface of said support beam and said first means for placing said support beam in compression applies substantially uniform compressive forces about a periphery of said support beam.

14. The transducer as recited in claim 10 wherein said support beam is elongated and is supported at opposed extemities thereof by support means which further apply opposing compressive forces thereto.

15. An actuator comprising:
   a) a beam comprising a first layer of material and a second layer of material bonded to said first layer;
   b) a first means for placing said support beam in compression without causing flexure of said support beam; and
   c) a second means for causing movement of said first layer and second layer to cause a flexure of said beam.

16. The actuator as recited in claim 15, wherein said first layer of material and second layer of material are comprised of piezoelectric materials.

17. The actuator as recited in claim 16, wherein said second means for causing movement causes a movement of said second layer in such a manner as to aid in the movement of said beam that is induced by said first layer.

18. The actuator as recited in claim 15, wherein said beam is symmetric about an axis that is orthogonal to said first surface of said beam and said first means for placing said support beam in compression applies substantially uniform compressive forces about a periphery of said beam.

19. The actuator as recited in claim 15, wherein said beam is elongated and is supported at opposed extemities thereof by support means which further apply opposing compressive forces thereto.

20. The actuator as recited in claim 15, wherein said first layer of material and second layer of material evidence different thermal coefficients of expansion.

21. A transducer comprising:
   a) a beam comprising a first layer of material and a second layer of material adhered to said said first layer of material;
   b) a first means for placing said support beam in compression without causing flexure of said support beam; and
   c) a second means for responding to a flexure of said first layer of material and said second layer of material for outputting a signal indicative thereof.

22. The transducer as recited in claim 21, wherein said first layer of material and said second layer of material are comprised of piezoelectric materials.

23. The transducer as recited in claim 22, wherein said beam is symmetric about an axis that is orthogonal to a first surface of said beam and said means for placing said support beam in compression applies substantially uniform compressive forces about a periphery of said beam.

24. The transducer as recited in claim 22, wherein said support beam is elongated and is supported at opposed extremities thereof by support means which further apply opposing compressive forces thereto.

* * * * *

UNITED STATES PATENT AND TRADEMARK OFFICE
CERTIFICATE OF CORRECTION

PATENT NO. : 6,236,143 B1  Page 1 of 1
DATED : May 22, 2001
INVENTOR(S) : George A. Lesieutre and Christopher L. Davis It is certified that error appears in the above-identified patent and that said Letters Patent is hereby corrected as shown below:

<u>Title page, Item [54], and Column 1, line 1,</u>
Please change the word "TRANSFER" in the title of the invention to -- TRANSDUCER. --

Signed and Sealed this

Twentieth Day of August, 2002

*Attest:*

*Attesting Officer*

JAMES E. ROGAN
*Director of the United States Patent and Trademark Office*